(12) United States Patent
Oonishi et al.

(10) Patent No.: US 10,731,535 B2
(45) Date of Patent: Aug. 4, 2020

(54) HONEYCOMB STRUCTURE BODY AND METHOD OF DESIGNING THE SAME

(71) Applicant: DENSO CORPORATION, Kariya, Aichi-pref. (JP)

(72) Inventors: Masahiro Oonishi, Yokohama (JP); Naohiro Hayashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 329 days.

(21) Appl. No.: 15/620,899

(22) Filed: Jun. 13, 2017

(65) Prior Publication Data

US 2017/0276048 A1   Sep. 28, 2017

Related U.S. Application Data

(62) Division of application No. 14/662,529, filed on Mar. 19, 2015, now Pat. No. 9,822,687.

(30) Foreign Application Priority Data

Mar. 20, 2014   (JP) .................................. 2014-058457

(51) Int. Cl.
    *F01N 3/28*    (2006.01)
    *B32B 3/12*    (2006.01)
    (Continued)

(52) U.S. Cl.
    CPC .............. *F01N 3/2803* (2013.01); *B32B 3/12* (2013.01); *C04B 38/0006* (2013.01);
    (Continued)

(58) Field of Classification Search
    CPC ..................................................... F01N 3/2803
    (Continued)

(56) References Cited

U.S. PATENT DOCUMENTS

2002/0042344 A1    4/2002   Kondo et al.
2007/0231533 A1    10/2007  Aniolek et al.
(Continued)

FOREIGN PATENT DOCUMENTS

JP    2002-177794    6/2002
JP    2008-018370    1/2008
(Continued)

OTHER PUBLICATIONS

Office Action dated May 5, 2017, issued in parent U.S. Appl. No. 14/662,529, filed Mar. 19, 2015 of Oonishi, et al., 7 pp.

*Primary Examiner* — Bijan Mapar
(74) *Attorney, Agent, or Firm* — Nixon & Vonderhye P.C.

(57) ABSTRACT

A honeycomb structure body has an inner side base section and an outer side base section having a cylindrical shape. Inner side cells are formed in the inner side base section at a constant cell density. Outer side cells are formed in the outer side base section. A cell density of the outer side cells varies a radius direction. The outer side cells are formed on the basis of a relational equation of $y=a(x-b)^n+c$, where x is a distance on the outer side base section measured from a central point on a radial cross section, y indicates the number of the outer side cells per one $cm^2$ at the distance x, a is a negative constant, b is a radius of the inner periphery of the outer side base section, c is the number of the inner side cells per one $cm^2$, and n is a degree.

6 Claims, 4 Drawing Sheets

AXIAL DIRECTION

(51) Int. Cl.
  *C04B 38/00* (2006.01)
  *G06F 30/20* (2020.01)
  *G06F 30/15* (2020.01)
  *C04B 111/00* (2006.01)

(52) U.S. Cl.
  CPC ........ *C04B 38/0009* (2013.01); *F01N 3/2828* (2013.01); *G06F 30/20* (2020.01); *C04B 2111/0081* (2013.01); *G06F 30/15* (2020.01); *Y02T 10/82* (2013.01); *Y10T 428/24149* (2015.01)

(58) Field of Classification Search
  USPC .......................................................... 703/7
  See application file for complete search history.

(56) References Cited

U.S. PATENT DOCUMENTS

| | | |
|---|---|---|
| 2013/0315788 A1 | 11/2013 | Suzuki et al. |
| 2014/0205794 A1 | 7/2014 | Tamai et al. |
| 2015/0267585 A1 | 9/2015 | Oonishi et al. |

FOREIGN PATENT DOCUMENTS

| | | |
|---|---|---|
| JP | 2009-532605 | 9/2009 |
| JP | 2012-200625 | 10/2012 |
| JP | 2013-154278 | 8/2013 |
| JP | 2013-173133 | 9/2013 |
| JP | 2013-173134 | 9/2013 |
| JP | 2013-244437 | 12/2013 |
| JP | 2014-136211 | 7/2014 |
| WO | WO 2013/111793 | 8/2013 |

AXIAL DIRECTION

HONEYCOMB STRUCTURE BODY AND METHOD OF DESIGNING THE SAME

CROSS-REFERENCE TO RELATED APPLICATION

This application is a Division of application Ser. No. 14/662,529, filed Mar. 19, 2015, and is related to and claims priority from Japanese Patent Application No. 2014-58457 filed on Mar. 20, 2014, the contents of each of which are hereby incorporated by reference.

BACKGROUND OF THE INVENTION

1. Field of the Invention

The present invention relates to honeycomb structure bodies and methods of designing honeycomb structure bodies

2. Description of the Related Art

There have been known and widely used honeycomb structure bodies used in catalyst converters mounted on exhaust gas purification systems for motor vehicles, capable of purifying exhaust gas emitted from internal combustion engines such as diesel engines. Such a honeycomb structure body is mounted on an inside of an exhaust gas pipe in an exhaust gas purification system connected to an internal combustion engine in order to purify exhaust gas. In general, a honeycomb structure body has an outer peripheral wall of a cylindrical shape, partition walls arranged in a lattice shape in the inside of the outer peripheral wall. In particular, the partition walls are formed to be arranged in a lattice shape to form a plurality of cells along an axial direction of the honeycomb structure body. That is, each of the cells is surrounded by the partition walls. The cells are formed along an axial direction of the honeycomb structure body, and catalyst is supported in the cells.

Exhaust gas emitted from the internal combustion engine is discharged outside through the exhaust gas pipe. Because exhaust gas is a high temperature gas, the catalyst supported in the honeycomb structure body is activated by heat energy of the exhaust gas. The honeycomb structure body supporting activated catalyst of a high temperature purifies the exhaust gas when the exhaust gas passes through the cells formed in the honeycomb structure body.

When the honeycomb structure body is divided into two sections, i.e. a central section (as an inner section) and an outer side section viewed on a radial cross section of the honeycomb structure body, there is in general a tendency that a large amount of exhaust gas passes through the cells arranged in the central section of the honeycomb structure body when compared with an amount of exhaust gas passing through the cells arranged in the outer side section of the honeycomb structure body in a radial cross section. Such a radial cross section of the honeycomb structure body is a cross section in a radial direction which is perpendicular to an axial direction or a longitudinal direction of the honeycomb structure body.

For example, a patent document, Japanese patent laid open publication No. 2002-177794 has disclosed a honeycomb structure body having a conventional structure in which a radial cross section of the honeycomb structure body is divided into two sections, i.e. a central section (as an inner section) and an outer side section. In order to improve the purification capability of exhaust gas, an amount of catalyst supported in the central section is increased, and on the other hand, an amount of catalyst supported in the outer side section is decreased.

However, the honeycomb structure body disclosed in the patent document previously described has a drawback as follows. The honeycomb structure body disclosed in the patent document has the central section of the honeycomb structure body in which a large amount of catalyst is supported in the cells of the central section in order to increase the exhaust gas purification capability of the central section as compared with that of the outer side section. However, this structure cannot solve the conventional problem previously described, i.e. cannot eliminate a difference in flow amount between the central section and the outer side section.

When such a difference in flow amount occurs between the central section and the outer side section, the central section becomes a high temperature and the outer side section becomes a low temperature. Accordingly, the outer side section requires a long period of time until a temperature of the cells with catalyst formed in the outer side section reaches the catalyst activation temperature when compared with the central section. Further, there is another possible problem that the cells of the outer side section cannot reach the activation temperature to sufficiently activate the catalyst. This reduces the purification capability of the honeycomb structure body.

SUMMARY

It is therefore desired to provide a honeycomb structure body having an improved cell structure and a method of designing the honeycomb structure body capable of passing exhaust gas emitted from an internal combustion engine through the overall cells at a constant flow speed, and purifying exhaust gas with high efficiency.

An exemplary embodiment provides a method of designing a honeycomb structure body having an inner side base section and an outer side base section. The inner side base section has a cylindrical shape in which a plurality of inner side cells are formed and arranged at a first cell density which is a constant value. The outer side base section has a cylindrical shape, which is formed outside of the inner side base section. In the outer side base section, a plurality of outer side cells are formed to be arranged at a second cell density which varies in a radial direction which is perpendicular to an axial direction of the honeycomb structure body. In particular, the method determines the number of the outer side cells to be formed in the outer side base section on the basis of a relational equation of $y=a(x-b)^n+c$, where a indicates an optional negative constant which represents a change rate of the second cell density of the outer side cells formed in the outer side base section, b indicates a radius of the inner periphery of the outer side base section, c indicates the number of the inner side cells per one $cm^2$ formed in the inner side base section, n indicates an optional degree, x indicates a distance on the outer side base section, measured from a central point on a radial cross section which is perpendicular to an axial direction of the honeycomb structure body, and y indicates the number of the outer side cells, to be formed in the outer side base section, per one $cm^2$ at the distance x measured from the central point.

In accordance with another exemplary embodiment, there is provided a honeycomb structure body having an inner side base section and an outer side base section. The inner side base section has a cylindrical shape in which a plurality of inner side cells are formed and arranged at a first cell density of a constant value. The outer side base section has a cylindrical shape, which is formed outside of the inner side base section. In the outer side base section, a plurality of outer side cells are formed and arranged at a second cell density which varies in a radial direction perpendicular to an axial direction of the honeycomb structure body. In addition, the outer side cells are formed in the outer side base section on the basis of a relational equation of $y=a(x-b)^n+c$, where a indicates an optional negative constant which represents a change rate of the second cell density of the outer side cells formed in the outer side base section, b indicates a radius of the inner periphery of the outer side base section, c indicates the number of the inner side cells per one $cm^2$ formed in the inner side base section, n indicates an optional degree, x indicates a distance on the outer side base section, measured from a central point on a radial cross section which is perpendicular to an axial direction of the honeycomb structure body, and y indicates the number of the outer side cells, formed in the outer side base section, per one $cm^2$ at the distance x measured from the central point.

The method of designing a honeycomb structure body provides the relational equation of $y=a(x-b)^n+c$. This makes it possible to correctly design an optimum structure of a honeycomb structure body having the inner side base section and the outer side base section through which exhaust gas can uniformly flows without any deviation of exhaust gas flow. That is, the honeycomb structure body designed by the method has a uniform distribution of flow speed of exhaust gas when the exhaust gas passes through the honeycomb structure body.

By the way, if overall cells are formed at a uniform cell density in a honeycomb structure body, and exhaust gas passes through the cells, there is a tendency to delay a flow speed of exhaust gas in the cells formed in an outer side section when compared with a flow speed of the exhaust gas in the cells formed in an inner side section which is near the central point of the honeycomb structure body. Further, there is a tendency to increase a change rate in flow speed of exhaust gas in the cells of the outer side section, as compared with that in the cells formed the inner side section.

After considering the problem previously described, the method according to the exemplary embodiment designs an improved structure of the honeycomb structure body having the inner side base section and the outer side base section. In this structure, exhaust gas flows, i.e. passes through the overall cells at a high speed, in which a variation or a change rate of flow speed of exhaust gas is relatively small. That is, exhaust gas passes through the inner side cells in the inner side base section at a constant flow speed. Because the inner side base section provides a uniform distribution of flow speed of exhaust gas, it is possible to form the inner side cells having a first cell density in the inner side base section. The first cell density is a constant cell density in which the inner side cells are uniformly arranged.

On the other hand, because exhaust gas passes through the outer side cells in the outer side base section at a relatively low speed, as compared with the flow speed of exhaust gas in the inner side cells arranged in the inner side base section, exhaust gas has a large change rate of flow speed in the outer side base section, the outer side cells are arranged at a second cell density which gradually decreases, i.e. varies from the inner periphery of the outer side base section to the outermost periphery of the honeycomb structure body. That is, the second cell density of the outer side cells formed in the outer side base section is lower than the first cell density (which is a constant cell density) of the inner side cells formed in the inner side base section. Furthermore, the method according to the exemplary embodiment designs the honeycomb structure body so that the second cell density of the outer side cells is decreased gradually from the inner periphery of the outer side base section to the outermost periphery of the honeycomb structure body.

The above exemplary embodiment provides the relational equation of $y=a(x-b)^n+c$ . . . (E1) in order to produce the honeycomb structure body having an improved structure and excellent purification capability of exhaust gas.

The following variables are optionally determined on the basis of various parameters, for example, a shape of the exhaust gas pipe to which the honeycomb structure body is applied:

Position of the inner periphery of the outer side base section;
Cell density of the inner side base section; and
Change rate of the cell density in the outer side base section.

Each of the values "a", "b", "c", and "n" is an optional constant value. That is, it is possible to determine these optional constant values "a", "b", "c", and "n" on the basis of various conditions to produce a honeycomb structure body. As a result, it is possible to easily produce the honeycomb structure body having a uniform distribution in flow speed of exhaust gas by using the relational equation of $y=a(x-b)^n+c$, . . . (E1).

It is possible for the exemplary embodiment to provide the honeycomb structure body having a uniform distribution in temperature when exhaust gas passes through the overall cells in the honeycomb structure body, and increase a temperature of the overall cells uniformly to an activation temperature of catalyst supported in the overall cells arranged in the honeycomb structure body. This makes it possible for the honeycomb structure body to have an excellent purification capability to purify exhaust gas emitted from an internal combustion engine with high efficiency.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
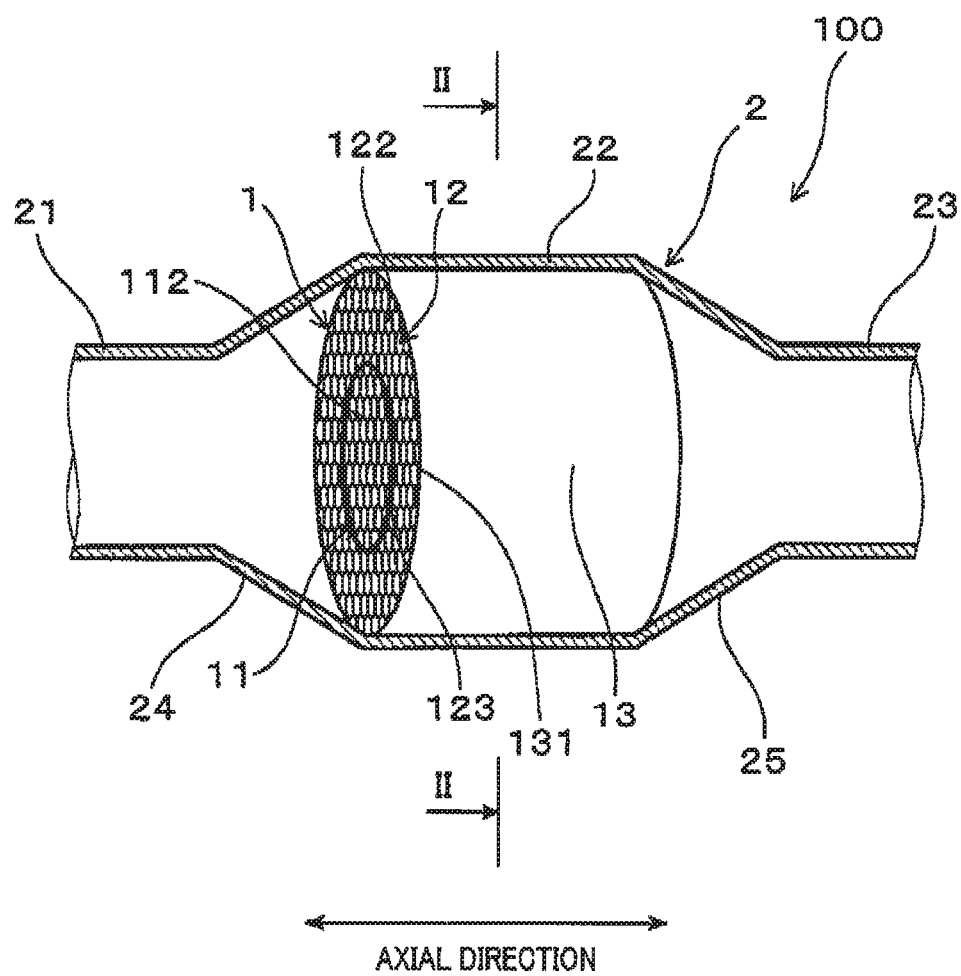
FIG. 1 is a view explaining a catalyst converter equipped with a honeycomb structure body according to an exemplary embodiment of the present invention.

Hereinafter, various embodiments of the present invention will be described with reference to the accompanying drawings. In the following description of the various embodiments, like reference characters or numerals designate like or equivalent component parts throughout the several diagrams.

A description will be given of a honeycomb structure body and a method of designing the honeycomb structure body according to preferred exemplary embodiments of the present invention.

It is preferable for the honeycomb structure body according to a preferred exemplary embodiment to have a structure which satisfies a relationship of $-0.1 \Leftarrow a \Leftarrow -0.01$, where reference character "a" indicates a constant value. Similarly, it is preferable for the design method according to a preferred exemplary embodiment to design a structure of a honeycomb structure body. The structure of the honeycomb structure body designed by the method satisfies a relationship of $-0.1 \Leftarrow a \Leftarrow -0.01$, where reference character "a" indicates a constant value. This structure makes it possible to form cells having an optional cell density in an outer side base section by using an outer side base material. Further, this structure makes it possible to provide a uniform distribution of flowing exhaust gas in the honeycomb structure body. As a result, exhaust gas can flow in the entire cells at a uniform flow speed in the honeycomb structure body. This makes it possible to improve the purification capability of the honeycomb structure body.

On the other hand, when the constant value "a" is less than 0.1 (a<0.1), the number "y" of the cells calculated by relational equation (E1) of $y=a(x-b)^n+c$ becomes a negative value. This structure has a possible problem of it being difficult to correctly form the outer side base section in a honeycomb structure body.

The important relational equation (E1) of $y=a(x-b)^n+c$ will be explained later in detail.

Further, it is preferable that the degree "n" used in the relational equation (E1) is within a range of $0<n<2.43$. This structure makes it possible to improve the purification capability of purifying exhaust gas when the honeycomb structure body is in a low load state in which a relatively low flow amount of exhaust gas passes through the honeycomb structure body.

Still further, it is preferable that the degree "n" used in the relational equation (E1) is within a range of $0<n<2.41$. In this case, in addition to the feature obtained when the honeycomb structure body is in a low load state previously described, it is possible for the honeycomb structure body to further improve the purification capability of purifying exhaust gas when the honeycomb structure body is in a high load state in which a relatively high flow amount of exhaust gas passes through the honeycomb structure body.

Still further, it is preferable for the honeycomb structure body according to the present invention to have a structure which satisfies a relationship of $0.2 R \Leftarrow b \Leftarrow 0.6 R$, where reference character "R" indicates a radius of an outer periphery of the honeycomb structure body, and reference character "b" indicates a radius of an inner periphery of the outer side base section.

A change of the flow speed of the exhaust gas becomes small in the area which satisfies that the radius "b" of the inner periphery of the outer side base section is within a range of $b<0.2 R$. Accordingly, in this area in the outer side base section of the honeycomb structure body, a flow speed of the exhaust gas has a uniform distribution.

In addition, a change of the flow speed of the exhaust gas becomes large in the area which satisfies that the radius "b" of the inner periphery of the outer side base section is within a range of $b>0.6 R$.

Accordingly, it is possible to reliably form the outer side base section in an area in which a change of a flow speed of exhaust gas becomes large when the radius "b" of the inner periphery of the outer side base section is within a range which satisfies the relationship of $0.2 R \Leftarrow b \Leftarrow 0.6 R$. This structure makes it possible for the honeycomb structure body to have a uniform distribution of a flow speed of exhaust gas with high efficiency.

Exemplary Embodiment

A description will now be given of a honeycomb structure body 1 according to an exemplary embodiment with reference to FIG. 1 and FIG. 2.

FIG. 1 is a view explaining a catalyst converter 100 using the honeycomb structure body 1 according to the exemplary embodiment. FIG. 2 is a view showing a partial cross section of the honeycomb structure body 1 to be used in the catalyst converter 100, along the line II-II shown in FIG. 1.

Figure 2:
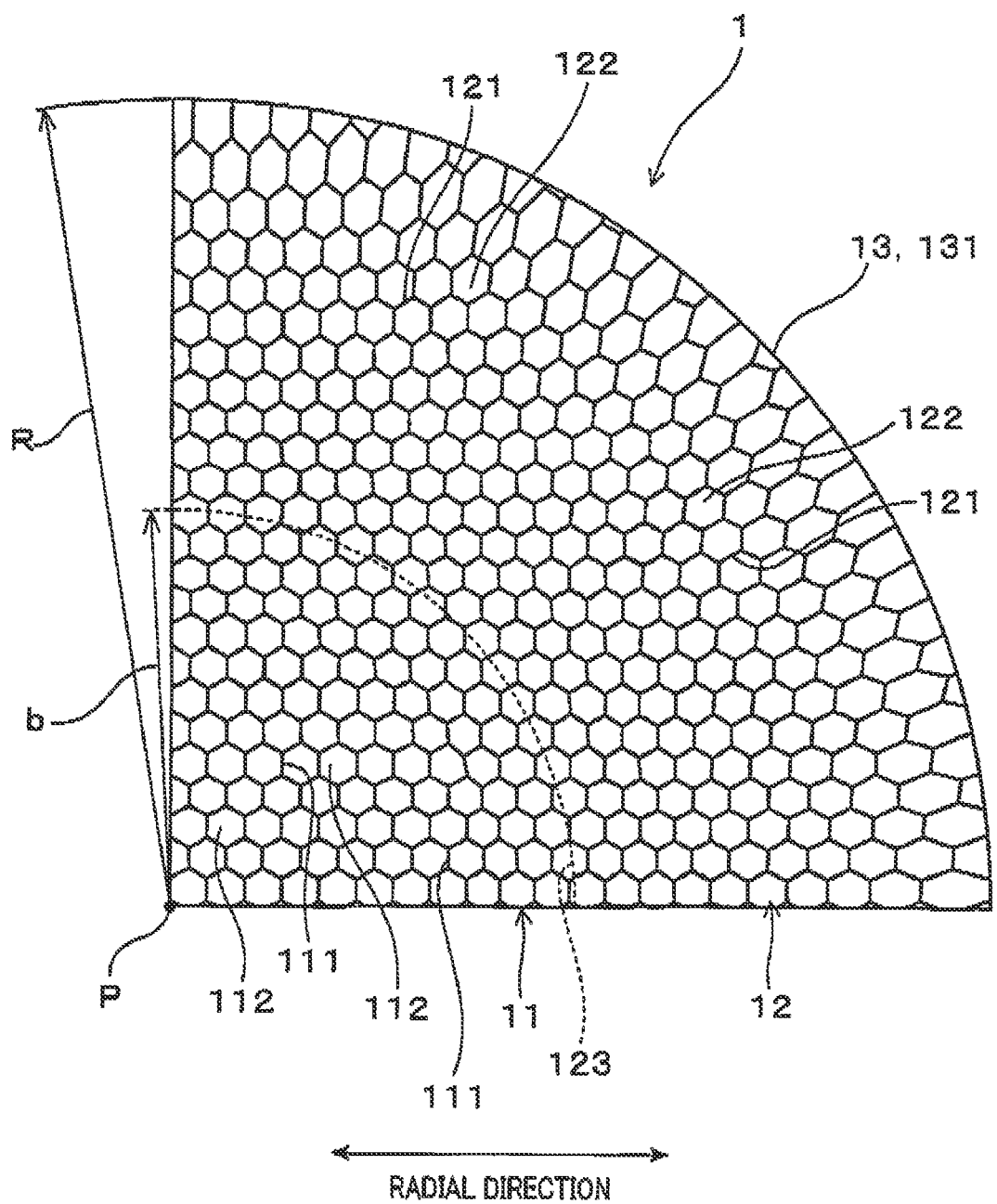
FIG. 2 is a view showing a partial cross section of the honeycomb structure body, along the line II-II shown in FIG. 1.

As shown in FIG. 1 and FIG. 2, the honeycomb structure body 1 according to the exemplary embodiment has a plurality of inner side cells 112 and outer side cells 122. That is, each of the inner side cells 112 and the outer side cells 122 is surrounded by partition walls to have a pipe shape formed extending in an axial direction of the honeycomb structure body 1. Exhaust gas emitted from an internal combustion engine (not shown) flows in the inner side cells 112 and the outer side cells 122 formed in the honeycomb structure body 1.

In particular, the cells 112 are formed in an inner side base section 11. The inner side base section 11 has a same cell density. On the other hand, the outer side cells 122 are formed in an outer side base section 12. The outer side base section 12 has a cell density which is changed from a radial direction of the honeycomb structure body 1.

The outer side cells 122 are formed in the outer side base section 12 in the honeycomb structure body 1 so that the number y of the outer side cells 122 is calculated on the basis of the relational equation (E1):

$$y=a(x-b)^n c, \qquad (E1),$$

where the reference character "x" indicates a distance measured from a central point P on a radial cross section which is perpendicular to an axial direction of the honeycomb structure body 1, and the reference character "y" indicates the number of the outer side cells 122 in the outer side base section 12 per one cm$^2$ at the distance x measured from the central point P.

In the relational equation (E1) of $y=a(x-b)^n c$ previously described, the reference character "a" indicates an optional negative constant which represents a change rate of a cell density, the reference character "b" indicates a radius of the inner periphery 123 of the outer side base section 12, the reference character "c" indicates the number of the inner side cells 112 per one cm$^2$ formed in the inner side base section 11, and the reference character "n" indicates an optional degree.

A description will now be given of the structure of the honeycomb structure body 1 according to the exemplary embodiment.

As shown in FIG. 1, the honeycomb structure body 1 according to the exemplary embodiment is mounted on a motor vehicle equipped with an internal combustion engine such as a diesel engine and a gasoline engine. The honeycomb structure body 1 purifies exhaust gas emitted from such an internal combustion engine. In more detail, the honeycomb structure body 1 is arranged at the inside of an exhaust gas pipe 2 which communicates with the internal combustion engine. The honeycomb structure body 1 and the exhaust gas pipe 2 form the catalyst converter 100.

The exhaust gas pipe 2 is comprised of a catalyst support pipe 22, an upstream side pipe 21 and a downstream side pipe 23.

The honeycomb structure body 1 is arranged in the inside of the catalyst support pipe 22. In other words, the catalyst support pipe 22 accommodates the honeycomb structure body 1. The upstream side pipe 21 is arranged at an upstream side of the catalyst support pipe 22. The upstream side pipe 21 is close to the internal combustion engine at the upstream side of exhaust gas. The downstream side pipe 23 is arranged at a downstream side of the catalyst support pipe 22.

The catalyst support pipe 22 has an inner diameter which is larger than a diameter of the upstream side pipe 21 and a diameter of the downstream side pipe 23. The honeycomb structure body 1 is arranged in an inside chamber of the catalyst support pipe 22. The catalyst support pipe 22 has an upstream side corn section 24 and a downstream side corn section 25. The upstream side corn section 24 is formed at an upstream side in the catalyst support pipe 22. A diameter of the upstream side corn section 24 gradually varies from the diameter of the upstream side pipe 21 to the diameter of the catalyst support pipe 22. Further, the downstream side corn section 25 is formed at a downstream side in the catalyst support pipe 22. A diameter of the downstream side corn section 25 gradually varies from the diameter of the catalyst support pipe 22 to the diameter of the downstream side pipe 23.

As shown in FIG. 1, the upstream side pipe 21 has a cylindrical shape. An outer periphery of the upstream side pipe 21 near a connection node between the upstream side pipe 21 and the upstream side corn section 24 has a straight-line shape so that a central axial of the upstream side pipe 21 and a central axis of the catalyst support pipe 22 form a coaxial axis. Similarly, an outer periphery of the downstream side pipe 23 near a connection node between the downstream side pipe 23 and the downstream side corn section 25 has a straight-line shape so that a central axial of the downstream side pipe 23 and a central axis of the catalyst support pipe 22 form a coaxial axis.

As shown in FIG. 1 and FIG. 2, the honeycomb structure body 1 according to the exemplary embodiment is comprised of a ceramic supporter and catalyst. The catalyst is supported in the ceramic supporter and capable of purifying exhaust gas when exhaust gas passes through the honeycomb structure body 1 and in contact with the catalyst.

The ceramic supporter in the honeycomb structure body 1 is comprised of inner side partition walls 111, outer side partition walls 121, the inner side cells 112 and the outer side cells 122. The inner side partition walls 111 and the outer side partition walls 121 are arranged in a lattice shape. That is, each of the inner side cells 112 is surrounded by the inner side partition walls 111. Similarly, each of the outer side cells 122 is surrounded by the outer side partition walls 121.

The honeycomb structure body 1 further has an outer peripheral wall 13 having a cylindrical shape. The outer periphery is covered with the outer peripheral wall 13. That is, in the structure of the honeycomb structure body 1 according to the exemplary embodiment, an outermost periphery 131 of the honeycomb structure body 1 has a diameter R of 51.5 mm.

As shown in FIG. 2, the honeycomb structure body 1 has the inner side base section 11 and the outer side base section 12. The inner side base section 11 is formed a radially inner side in a radial cross section of the honeycomb structure body 1. On the other hand, the outer side base section 12 is formed a radially outer side in the radial cross section of the honeycomb structure body 1. The inner side base section 11 is arranged adjacently to the outer side base section 12. That is, the outer side base section 12 is formed between the outer periphery of the inner side base section 11 and the outermost periphery 131 of the honeycomb structure body 1.

The inner side base section 11 has a cylindrical shape or a columnar shape. The inner side base section 11 has a plurality of the inner side partition walls 111 arranged in a lattice shape and a plurality of the inner side cells 112. Each of the inner side cells 112 are surrounded by the inner side partition walls 111. The inner side cells 112 are formed in a longitudinal direction, i.e. an axial direction of the honeycomb structure body 1. In particular, each of the inner side cells 112 has a radial cross section having a hexagonal shape. The inner side cells 112 are arranged at a same cell density in the inner side base section 11. In the structure of the honeycomb structure body 1 according to the exemplary embodiment, the inner side base section 11 has a first cell density in which the number of the inner side cells 112 per one cm$^2$ is 116. That is, the n umber c of the inner side cells 112 in the inner side base section 11 is a value of 116 (c=116).

The outer side base section 12 has a cylindrical shape or a columnar shape. The inner side base section 11 is formed in the inner circumference side of the outer side base section 12.

The outer side base section 12 has a plurality of the outer side partition walls 121 arranged in a lattice shape and a plurality of the outer side cells 122. Each of the outer side cells 122 are surrounded by the outer side partition walls 121. Similar to the inner side cells 112, the outer side cells 122 are formed in a longitudinal direction, i.e. an axial direction of the honeycomb structure body 1. In particular, each of the outer side cells 122 has a radial cross section having a hexagonal shape.

In the structure of the honeycomb structure body 1 according to the exemplary embodiment, an innermost periphery 123 of the outer side base section 12 has a radius "b" of 20 mm (b=20 mm).

When a flow passage of the upstream side pipe 21 has a diameter R1, the following relationship is satisfied:

$$b = 0.39 R1,$$

where b indicates a radius of the innermost periphery 123 of the outer side base section 12.

The method according to the exemplary embodiment designs the outer side base section 12 in the honeycomb structure body 1 on the basis of the relational equation (E1) of $y = a(x-b)^n c$. In this relational equation (E1), reference character "a" indicates an optional negative constant which represents a change rate of a cell density in the outer side base section 12, and reference character "n" indicates an optional degree. In the exemplary embodiment, $a = -0.046$, and $n = 2$. Further, as previously described, the innermost periphery 123 of the outer side base section 12 has a radius b of 20 (b=20), and the number of the inner side cells 112 per one cm², formed in the inner side base section 11 is 116 (c=116). When the values a, b, c and n are inputted into the relational equation (e1), the following relational equation (E2) is obtained.

$$y = -0.046(x-20)^2 + 116, \quad \text{(E2)}.$$

When the distance "x" measured from the central point P is inserted into the equation (E2), the number "y" of the cells per one cm² at the distance x is obtained. The distance "x" is present between the innermost periphery 123 of the outer side base section 12 and the outermost periphery of the outer side base section 12. That is, the following result is obtained:

$$20 \Leftarrow x \Leftarrow 51.5.$$

In particular, the number "y" of the cells outer side cells 122 in the outer side partition walls 121 is sequentially changed on the basis of the distance "x" so that the cell density of the outer side cells 122 is decreased from the inner circumference side to the outer circumference side of the outer side base section 12.

By the way, the method according to the exemplary embodiment produces a metal die having a structure which corresponds to the specific structure of the cell arrangement of the inner side sells 112 and the outer side cells 122 in the honeycomb structure body 1.

For example, a manufacturing method produces the honeycomb structure body 1 by using the metal dies having the specific structure which has been designed by the method according to the exemplary embodiment previously described.

The manufacturing method produces prepares ceramic raw material, and adds water, binder, etc. to the prepared ceramic raw material, and mixes it to produce a mixture.

The manufacturing method extrudes the mixture by using an extrusion metal die to produce a honeycomb structure molded body. The metal die produced by the design method according to the exemplary embodiment has a cross section having a pattern of slit grooves which correspond to the arrangement of the inner side cells 112 and the outer side cells 122 of the honeycomb structure body 1.

The manufacturing method dries the honeycomb structure molded body by using microwaves. After the drying step, the manufacturing method cuts the dried honeycomb structure body to a plurality of parts having a desired length. After this, the manufacturing method fires the honeycomb structure body having the desired length at a predetermined temperature to produce the honeycomb structure body 1.

A description will now be given of the action and effects of the honeycomb structure body 1 and the design method of designing the honeycomb structure body 1 according to the exemplary embodiment.

The design method of designing the structure of the honeycomb structure body 1 according to the exemplary embodiment provides the relational equation (E1) and the other various relationships in order to correctly determine an optimum structure of the inner side base section 11 having the inner side cells 112 and the outer side base section 12 having the outer side cells 122 in the honeycomb structure body 1. This makes it possible to design and produce the honeycomb structure body 1 having a uniform gas-flow speed distribution capable of passing exhaust gas through the overall cells at a uniform flow speed. That is, exhaust gas can flow at a constant flow speed in the entire cells formed in the honeycomb structure body 1.

If a honeycomb structure has a uniform cell density, there is a tendency to more delay a flow speed of exhaust gas in an outer side when compared with a flow speed of exhaust gas in an inner side which is near the central point of the honeycomb structure body. Further, there is a tendency to increase a change rate of flow speed of exhaust gas at the outer side, when compared with a change rate of flow speed in the inner side, which is near the central point in a radial cross section which is perpendicular to an axial direction of the honeycomb structure body.

The method according to the exemplary embodiment considers and eliminates this tendency caused when the overall cells are formed in a uniform cell density, and provides the improved structure comprised of the inner side base section 11 and the outer side base section 12 in the honeycomb structure body 1.

In general, exhaust gas passes through the cells at a high speed, and a variation or a change rate of flow speed of exhaust gas is relatively small. That is, exhaust gas passes through the cells formed and arranged in the inner side base section 11 at a constant flow speed. Because the inner side base section 11 has a uniform distribution of flow speed of exhaust gas, it is possible form the inner side base section 11 to have a first cell density which is a constant cell density in which the inner side cells 112 are uniformly arranged to have a constant cell density.

On the other hand, because exhaust gas passes through at a relatively low speed, as compared with the flow speed of exhaust gas in the inner side base section 11, exhaust gas has a large change rate of flow speed in the outer side base section 12, the outer side cells 122 has a second cell density which gradually decreases, i.e. varies from the inner periphery 123 of the outer side base section 12 to the outermost periphery 131 of the honeycomb structure body 1. That is, the second cell density of the outer side cells 122 formed in the outer side base section 12 is lower than the first cell density (which is a constant cell density) of the inner side cells 112 formed in the inner side base section 11. Furthermore, the design method according to the exemplary embodiment designs that the second cell density of the outer side cells 122 is decreased gradually from the inner periphery 123 of the outer side base section 12 to the outermost periphery 131 of the honeycomb structure body 1.

The exemplary embodiment provides the relational equation of $y = a(x-b)^n + c$ . . . (E1) in order to produce the honeycomb structure body 1 having a specific structure.

The following parameters (a), (b) and (c) are optionally determined on the basis of various condition, for example, a shape of the exhaust gas pipe to which the honeycomb structure body 1:

(a) Position of the inner periphery 123 of the outer side base section 12;
(b) Cell density of the inner side base section 11; and
(c) Change rate of the cell density in the outer side base section 12.

Each of the values "a", "b", "c", and "n" is an optional constant value. That is, it is possible to determine these optional constant values "a", "b", "c", and "n" on the basis of various conditions to produce a honeycomb structure body.

As a result, it is possible to easily produce the honeycomb structure body 1 having a uniform distribution in flow speed of exhaust gas by using the relational equation of $y = a(x-b)^n + c$, . . . (E1).

It is possible for the exemplary embodiment to provide the honeycomb structure body 1 having a uniform gas-flow speed distribution in temperature when exhaust gas passes through the honeycomb structure body 1, and uniformly increases a temperature of the overall cells of the honeycomb structure body 1 to an activation temperature of catalyst supported in the honeycomb structure body 1. This makes it possible for the honeycomb structure body 1 to purify exhaust gas emitted from an internal combustion engine with high efficiency.

In addition, when the honeycomb structure body 1 according to the exemplary embodiment is produced, the constant "a" is within a range of $-0.1 \Leftarrow a \Leftarrow -0.01$ in the relational equation of $y=a(x-b)^n+c, \ldots$ (E1). This makes it possible to form the outer side cells 122 at an optimum cell density in an outer side base section 12. This makes it also possible to provide a uniform distribution in flow speed of exhaust gas in the overall cells of the honeycomb structure body 1, and improve the purification capability thereof.

Further, when the honeycomb structure body 1 according to the exemplary embodiment is produced, the degree "n" is within a range of $0<n<2.41$ in the relational equation of $y=a(x-b)^n+c, \ldots$ (E1). This makes it possible for the honeycomb structure body 1 to provide improved purification capability of purifying exhaust gas even if the honeycomb structure body 1 is in a high load, i.e. a large amount of exhaust gas passes through the honeycomb structure body 1.

Still further, when the honeycomb structure body 1 according to the exemplary embodiment is produced, the following relationship is satisfied in the relational equation (E1): $0.2 \text{ R} \Leftarrow b \Leftarrow 0.6 \text{ R}$, where reference character "R" indicates a radius of an outer periphery of the honeycomb structure body 1, and reference character "b" indicates a radius of the inner periphery 123 of the outer side base section 12. This makes it possible to reliably and correctly form the outer side base section 12 within an area in which exhaust gas has a large change rate of its flow speed. In addition. it is possible to produce the honeycomb structure body 1 with a uniform distribution of flow speed of exhaust gas.

Still further, the honeycomb structure body 1 according to the exemplary embodiment has the improved structure previously described. That is, the outer side base section 12 is formed between the outer periphery of the inner side base section 11 and the outermost periphery 131 of the honeycomb structure body 1. Because the outer peripheral side of the honeycomb structure body 1 is formed in the outer side base section 12 in which exhaust gas has a high change rate of its flow speed, this structure makes it possible for the honeycomb structure body 1 have a uniform distribution of flow speed of exhaust gas and to flow exhaust gas uniformly in the overall cells in the honeycomb structure body 1 with high efficiency.

As previously described in detail, it is possible for the design method according to the exemplary embodiment to design an improved structure of the honeycomb structure body 1 having a uniform gas-flow speed distribution. This structure makes it possible for exhaust gas to flow uniformly in the overall cells in the honeycomb structure body 1 with high efficiency.

First Experimental Test

A description will now be given of a first experimental test to detect the purification capability of test samples as honeycomb structure bodies having various degrees "n".

The test samples were produced on the basis of the relational equation of $y=-0.046 (x-20)^n+116$, where $a=-0.046$, $b=20$, and $c=116$ in the relational equation (E1) of $y=a(x-b)^n+c$.

The first experimental test gradually increased the degree "n" from zero in order to produce the test samples. Other components of the test samples are the same of those of the honeycomb structure body 1 according to the exemplary embodiment previously described.

Figure 3:
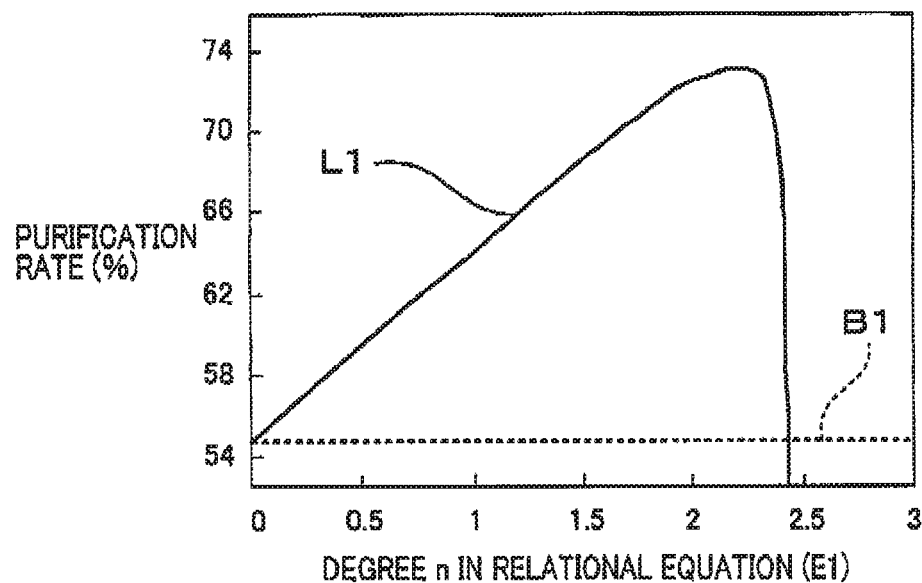
FIG. 3 is a graph showing experimental results of test samples obtained by a first experimental test, which indicate a relationship between a purification rate (%) of exhaust gas and a degree "n" in a relational equation of $y=a(x-b)^n+c$, when test samples were in a low load state.
Figure 4:
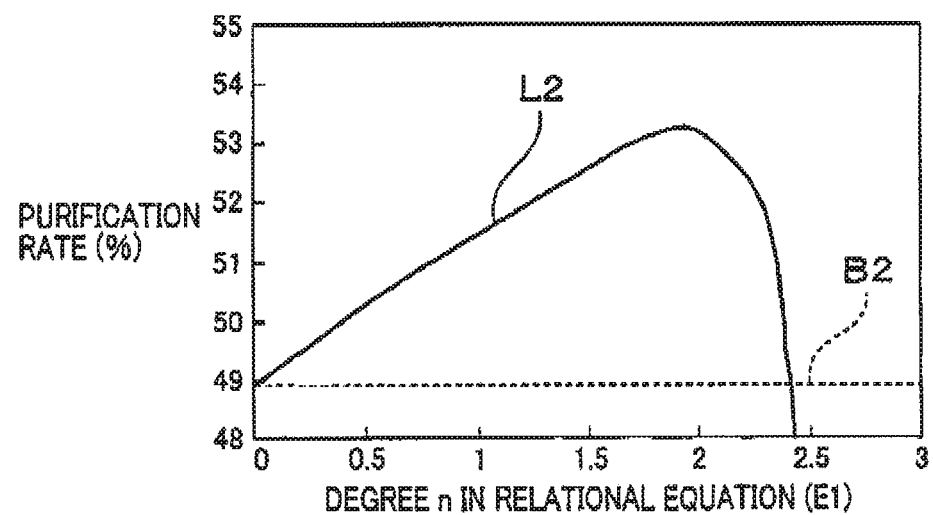
FIG. 4 is a graph showing experimental results of test samples obtained by the first experimental test, which indicate a relationship between the purification rate (%) of exhaust gas and the degree "n" in the relational equation of $y=a(x-b)^n+c$, when the test samples were in a high load state.

FIG. 3 is a graph showing experimental results of test samples obtained by the first experimental test. That is, the graph shown in FIG. 3 indicates a relationship between a purification rate (%) of exhaust gas and the degree "n" in the relational equation (E1) of $y=a(x-b)^n+c$ when the test samples were in a low load state. FIG. 4 is a graph showing experimental results of test samples obtained by the first experimental test. That is, the graph shown in FIG. 4 indicates a relationship between the purification rate (%) of exhaust gas and the degree "n" in the relational equation of $y=a(x-b)^n+c, \ldots$ (E1) when the test samples were in a high load state.

In FIG. 3 and FIG. 4, vertical axis indicates the purification rate (%) of exhaust gas, and horizontal axis indicates the degree "n" in the relational equation of $y=a(x-b)^n+c, \ldots$ (E1).

The curve L1 in FIG. 3 indicates the relationship between the purification rate (%) of exhaust gas and the degree "n" in the relational equation of $y=a(x-b)^n+c, \ldots$ (E1) when exhaust gas introduced into the test sample has a flow amount of 20 (g/s) and a temperature of 500° C. The dotted line B1 shown in FIG. 3 indicates a purification rate (%) of exhaust gas when cells were formed at a constant cell density (116 cells/cm$^2$) in the test samples.

The curve L2 in FIG. 4 indicates the relationship between the purification rate (%) of exhaust gas and the degree "n" in the relational equation of $y=a(x-b)^n+c, \ldots$ (E1) when exhaust gas introduced into the test samples has a flow amount of 60 (g/s) and a temperature of 800° C. The dotted line B2 in FIG. 4 indicates a purification rate (%) of exhaust gas when the cells were formed at the constant cell density (116 cells/cm$^2$) in the test samples.

As shown in FIG. 3, when the degree "n" is 0 (n=0), the test sample as the honeycomb structure body has a purification rate which is approximately equal to the purification rate of the test sample (indicated by the dotted line B1) having the same cell density.

The more the degree "n" gradually increases from zero (n=0), the more the purification rate of the test samples gradually increases. For example, when the degree "n" is 2.25 (n=2.25), the test sample has the maximum purification rate. When the degree "n" exceeds 2.25 (n>2.25), the purification rate of the test samples is drastically decreased.

When the degree "n" is not less than 2.43 (n>=2.43), the purification rate of the test samples is lower than that of the test sample indicated by the dotted line B1. That is, it can be understood from the experimental results shown in FIG. 3, as compared with the test sample in which the cells (i.e. the cells 112 and the cells 122) are formed at the same cell density indicated by the dotted line B1, the honeycomb structure body has an excellent purification rate capable of purifying exhaust gas as long as the degree "n" is within a range of $0<n<2.43$ even if the test sample is in a low load state.

As shown in FIG. 4, when the degree "n" is 0 (n=0), the test sample as the honeycomb structure body has a purification rate which is approximately equal to the purification rate of the test sample (indicated by the dotted line B2) having the same cell density.

The more the degree "n" gradually increases from zero (n=0), the more the purification rate of the test samples gradually increases. For example, when the degree "n" is 2 (n=2), the test sample has the maximum purification rate. When the degree "n" exceeds 2 (n>2), the purification rate of the test samples is drastically decreased.

When the degree "n" is not less than 2.41 (n>=2.41), the purification rate of the test samples is lower than that of the test sample indicated by the dotted line B2. That is, it can be understood from the experimental results shown in FIG. 4, as compared with the test sample, in which the cells (i.e. the cells 111 and the cells 112) are formed at the same cell density, indicated by the dotted line B2, the honeycomb structure body has an excellent purification rate capable of purifying exhaust gas as long as the degree "n" is within a range of 0<n<2.41 even if the test sample is in a high load state.

Second Experimental Test

A description will now be given of a second experimental test to detect a distribution of flow speed (m/s) of exhaust gas in test samples as honeycomb structure bodies.

Figure 5:
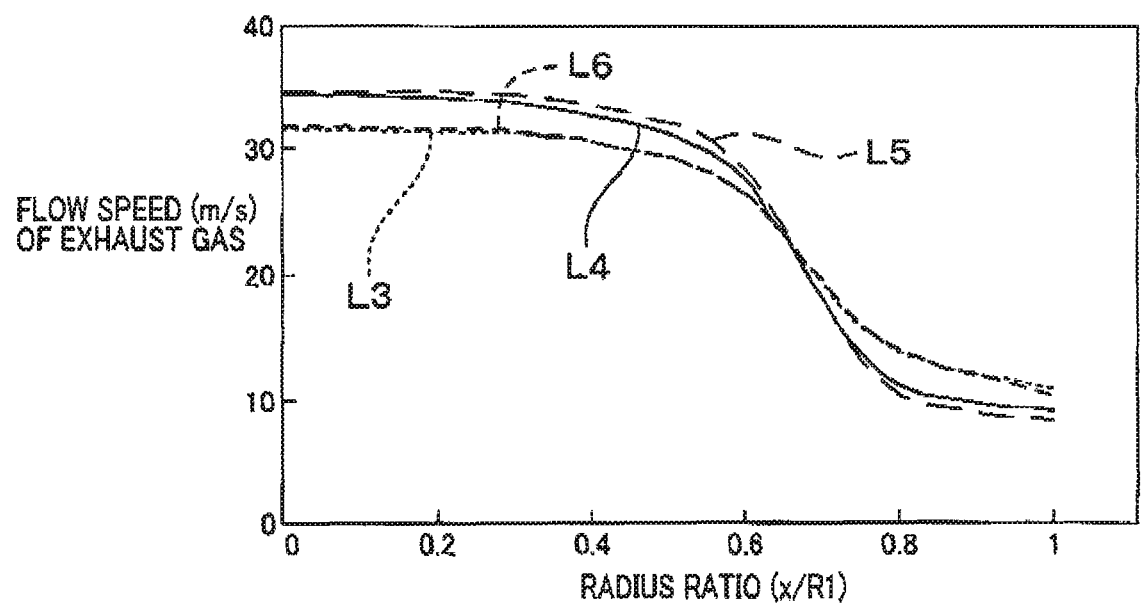
FIG. 5 is a graph showing experimental results of test samples obtained by a second experimental test, which indicates a relationship between a radius ratio and a distribution of flow speed of exhaust gas in the test samples, where the radius ratio of each test sample indicates a ratio of a distance measured from a central point P of each test sample to a radius of an upstream side pipe.
Figure 6:
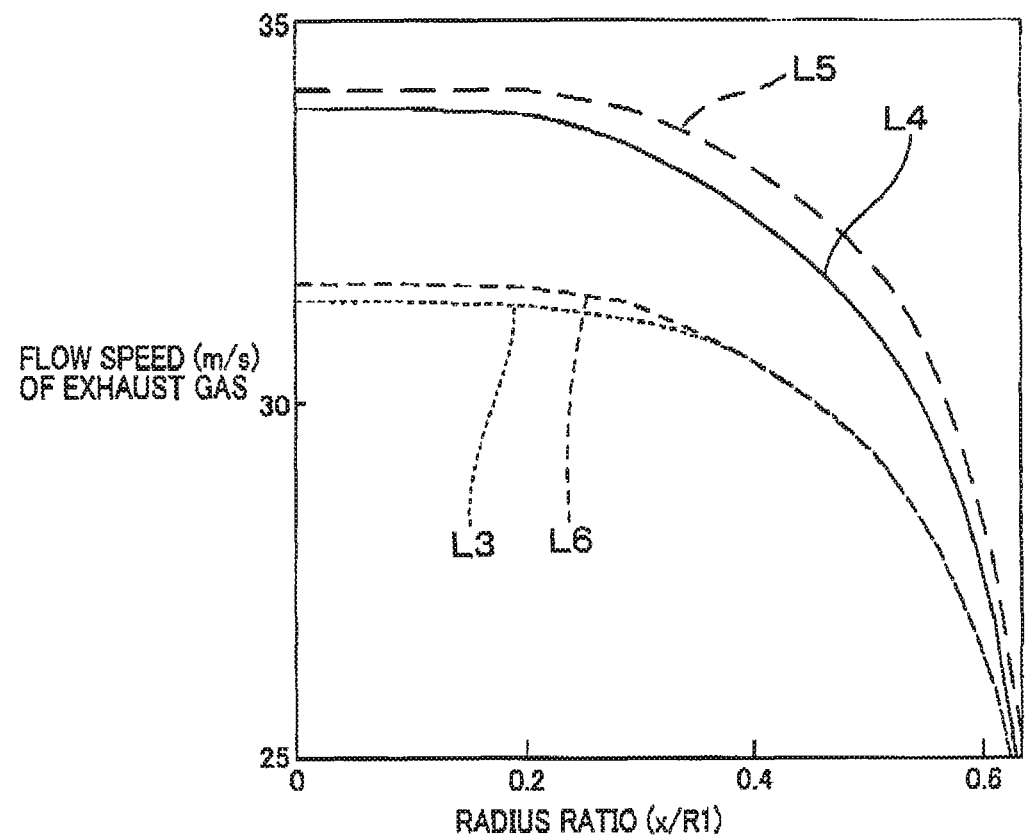
FIG. 6 is a partial enlarged view of the graph shown in FIG. 5.

FIG. 5 is a graph showing experimental results of test samples obtained by the second experimental test. That is, the graph shown in FIG. 5 indicates a relationship between a radius ratio (x/R1) and a distribution of flow speed (m/s) of exhaust gas in the test samples. FIG. 6 is a partial enlarged view of the graph shown in FIG. 5.

In FIG. 5 and FIG. 6, the vertical axis indicates a flow speed (m/s) of exhaust gas which passes through each test sample, and the horizontal axis indicates the radius ratio (x/R1). In more detail, each test sample is a honeycomb structure body having a structure in which cells are formed at a constant cell density and the test samples have the same cell density. In FIG. 5, the radius ratio (x/R1) indicates a ratio of a distance "x" measured from a central point "P" to a radius "R1" of an upstream side pipe. This upstream side pipe corresponds to the upstream side pipe 21 shown in FIG. 1. In particular, the curves L3 and L4 shown in FIG. 5 and FIG. 6 indicate two groups of the test samples having a same cell density (116 cells per cm$^2$) and different lengths (L3: 130 mm, L4: 105 mm). The curves L5 and L6 shown in FIG. 5 and FIG. 6 indicate two groups of the test samples having a same cell density (93 cells per cm$^2$) and different lengths (L5: 130 mm, L6: 105 mm).

That is, the curve L3 shown in FIG. 5 and FIG. 6 indicates the group of the test samples (as honeycomb structure bodies) having cells formed at the cell density of 116 cells/cm$^2$ and the length of 130 mm. The curve L4 shown in FIG. 5 and FIG. 6 indicates the group of the test samples (as honeycomb structure bodies) having cells formed at the cell density of 116 cells/cm$^2$ and the length of 105 mm. The curve L5 shown in FIG. 5 and FIG. 6 indicates the group of the test samples (as honeycomb structure bodies) having cells formed at the cell density of 93 cells/cm$^2$ and the length of 130 mm. The curve L6 shown in FIG. 5 and FIG. 6 indicates the group of the test samples (as honeycomb structure bodies) having cells formed at the cell density of 93 cells/cm$^2$ and the length of 105 mm. Other components of the test samples used in the second experimental test are the same of those of the honeycomb structure body 1 according to the exemplary embodiment previously described.

As shown in FIG. 5 and FIG. 6, as compared with a flow speed of exhaust gas passing through a central area around the central point P of each test sample (honeycomb structure body), when the radius ratio (x/R1) is less than 0.2 in each of the curves L3 to L6, a change rate of flow speed of exhaust gas is extremely small. It can be recognized that an inflection point of flow speed of exhaust gas is detected in the test sample having the radius ratio of 0.2.

In addition, it can be recognized that a change rate of flow speed of exhaust gas increases in the test samples having a radius ratio of more than 0.6.

Accordingly, it is possible to provide a honeycomb structure body having an improved structure in which the outer side base section is reliably formed from a first formation area to a second formation area. That is, in the first formation area, exhaust gas passes through at a relatively low flow speed. In the second formation area, exhaust gas passes through at a high flow speed when the honeycomb structure body satisfies the relationship of 0.2 R$\Leftarrow$b$\Leftarrow$0.6 R, where reference character "R" indicates a radius of the outer periphery of the honeycomb structure body, and reference character "b" indicates a radius of the inner periphery of the outer side base section in the honeycomb structure body.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A computer implemented method of designing and producing a honeycomb structure body by using a central processing unit, comprising:
    designing and producing an inner side base section having a cylindrical shape in which a plurality of inner side cells are formed and arranged at a first cell density of a constant value; and
    designing and producing an outer side base section having a cylindrical shape, formed outside of the inner side base section, in which a plurality of outer side cells are formed to be arranged at a second cell density which varies in a radial direction which is perpendicular to an axial direction of the honeycomb structure body so as to uniformly flow exhaust gas in the inner side base section and the outer side base section without deviation of exhaust gas flow,
    wherein the number of the outer side cells are formed in the outer side base section on the basis of a relational equation of $y=a(x-b)^n+c$,
    where a indicates an optional negative constant which represents a change rate of the second cell density of the outer side cells formed in the outer side base section,
    b indicates a radius of the inner periphery of the outer side base section,
    c indicates the number of the inner side cells per one cm2 formed in the inner side base section,
    n indicates an optional degree,
    x indicates a distance on the outer side base section, measured from a central point on a radial cross section which is perpendicular to an axial direction of the honeycomb structure body, and y indicates the number of the outer side cells, to be formed in the outer side base section, per one cm2 at the distance x measured from the central point; and wherein the degree n in the relational equation of $y=a(x-b)^n+c$ satisfies a relationship of $0<n<2.43$.

2. A computer implemented method of designing and producing a honeycomb structure body by using a central processing unit comprising:

designing and producing an inner side base section having a cylindrical shape in which a plurality of inner side cells are formed and arranged at a first cell density of a constant value; and designing and producing an outer side base section having a cylindrical shape, formed outside of the inner side base section, in which a plurality of outer side cells are formed to be arranged at a second cell density which varies in a radial direction which is perpendicular to an axial direction of the honeycomb structure body, so as to uniformly flow exhaust gas in the inner side base section and the outer side base section without deviation of exhaust gas flow, wherein the number of the outer side cells are formed in the outer side base section on the basis of a relational equation of $y=a(x-b)^n+c$, where a indicates an optional negative constant which represents a change rate of the second cell density of the outer side cells formed in the outer side base section, b indicates a radius of the inner periphery of the outer side base section, c indicates the number of the inner side cells per one cm2 formed in the inner side base section, n indicates an optional degree, x indicates a distance on the outer side base section, measured from a central point on a radial cross section which is perpendicular to an axial direction of the honeycomb structure body, and y indicates the number of the outer side cells, to be formed in the outer side base section, per one cm2 at the distance x measured from the central point, and wherein the degree n in the relational equation of $y=a(x-b)^n+c$ satisfies a relationship of $0<n<2.41$.

3. The method according to claim 1, wherein the honeycomb structure body satisfies a relationship of $0.2R \Leftarrow b \Leftarrow 0.6R$, where R indicates a radius of an outer periphery of the honeycomb structure body, and b indicates a radius of an inner periphery of the outer side base section.

4. The method according to claim 1, wherein the outer side base section is formed between an outer periphery of the inner side base section and an outermost periphery of the honeycomb structure body.

5. The method according to claim 2, wherein the honeycomb structure body satisfies a relationship of $0.2R \Leftarrow b \Leftarrow 0.6R$, where R indicates a radius of an outer periphery of the honeycomb structure body, and b indicates a radius of an inner periphery of the outer side base section.

6. The method according to claim 2, wherein the outer side base section is formed between an outer periphery of the inner side base section and an outermost periphery of the honeycomb structure body.

* * * * *